(12) United States Patent
Yamamoto

(10) Patent No.: US 6,411,161 B1
(45) Date of Patent: Jun. 25, 2002

(54) AC COUPLING CIRCUIT

(75) Inventor: Masahiro Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/931,106

(22) Filed: Aug. 17, 2001

(30) Foreign Application Priority Data

Apr. 5, 2001 (JP) ........................................ 2001-107025

(51) Int. Cl.$^7$ ................................................. H03F 1/36
(52) U.S. Cl. ............................ 330/85; 330/69; 330/141
(58) Field of Search ............................ 330/69, 85, 109, 330/141

(56) References Cited

U.S. PATENT DOCUMENTS

| | | | |
|---|---|---|---|
| 4,086,541 A | * 4/1978 | Katou et al. | 330/51 |
| 4,152,659 A | * 5/1979 | Gordon | 330/9 |
| 5,095,282 A | * 3/1992 | Dayton | 330/69 |
| 5,113,144 A | * 5/1992 | Song | 330/85 |

FOREIGN PATENT DOCUMENTS

JP 53-129569 * 11/1978 .................. 330/85

OTHER PUBLICATIONS

National Semiconductor Corporation, Instrumentation Amplifier, Jun. 1969, IEEE, vol. 17, No. 6, p. 129–130.*

* cited by examiner

*Primary Examiner*—Robert Pascal
*Assistant Examiner*—Henry Choe
(74) *Attorney, Agent, or Firm*—Oblon, Spivak, McClelland, Maier & Neustadt, P.C.

(57) ABSTRACT

The invention provides an AC coupling circuit for receiving an output signal from a signal processing circuit having a first differential amplifier which has an inverting input and a non-inverting input, and for transmitting the output signal to a stage subsequent to the signal processing circuit as an AC signal. The first differential amplifier receives an input signal with a predetermined potential and a signal with a reference potential to differentially amplify the signals. The AC coupling circuit comprises a CR circuit including a resistor and a capacitor, and a feedback circuit. The feedback circuit includes a second differential amplifier for detecting a potential difference between a node of a stage previous to the CR circuit and a node of a stage subsequent to the CR circuit with reference to the potential of the node of the subsequent stage to the CR circuit to amplify the potential difference. The feedback circuit feeds back the amplified potential difference to the non-inverting input of the first differential amplifier of the signal processing circuit.

5 Claims, 6 Drawing Sheets

AC COUPLING CIRCUIT

BACKGROUND OF THE INVENTION

1. Field of the Invention

The present invention relates to an AC coupling circuit for coupling an AC output signal from an AC signal processing circuit to a circuit subsequent to the AC signal processing circuit.

2. Description of the Prior Art

In general, since the sensitivities of various sensors such as semiconductor sensors are very low, output signals from the sensors must be amplified to an appropriate level.

Sensor outputs are varied due to the variance of sensors or the like in manufacturing, and therefore the sensor outputs are hardly processed by DC signals. For this reason, the output signals from the sensors are amplified by a plurality of amplifying circuits. In this case, the output signals are coupled to a first-stage amplifier to reduce the influence of variance of outputs of DC signals (AC signal processing).

FIG. 5 shows the configuration of a conventional AC coupling circuit. A signal from a half bridge circuit comprising resistors $R_1$ and $R_2$ which serve as a sensor is input to a buffer $A_2$ comprising a differential amplifier. At the same time, a reference potential is input from a half bridge circuit comprising resistors $R_3$ and $R_4$ to a buffer $A_1$ comprising by a differential amplifier. The buffers $A_1$ and $A_2$ perform impedance conversion. Outputs from the buffers $A_1$ and $A_2$ are input to a first-stage amplifier $A_3$ and differentially amplified by using a reference potential given by the resistors $R_5$ and $R_6$. Then the outputs are transmitted to a stage subsequent to the first-stage amplifier $A_3$ through an AC coupling circuit 11. As the AC coupling circuit 11, a CR circuit comprising a capacitor C1 and a resistor $R_{16}$ is generally used, as shown in FIG. 1.

In this case, due to the variance of DC signals of sensor outputs, the potential difference between the potential of a stage (that is, the first-stage amplifier $A_3$) previous to the AC coupling circuit 11 and the reference potential of a stage subsequent to the AC coupling circuit 11 may be large. In addition, the previous stage output also has temperature characteristic due to the temperature characteristic of the sensor output. For this reason, an increase in the temperature raises the potential difference. More specifically, when the DC potential component in the sensor output (potential of the middle point between the resistor $R_1$ and the resistor $R_2$) is varied due to a variance in manufacturing or temperature characteristic, this variation causes the output potential of the first-stage amplifier $A_3$ to vary with respect to the reference potential of the subsequent stage obtained by the resistor $R_{11}$ and the resistor $R_{12}$. That is, a potential difference is generated between the output potential of the first-stage amplifier $A_3$ and the reference potential of the subsequent stage obtained by the resistor $R_{11}$ and the resistor $R_{12}$.

When no power supply voltage is applied, the a capacitor C1 of the AC coupling circuit 11 is not charged. When the power supply voltage is applied, the capacitor C1 is charged by the potential difference between the potential of the previous stage of the AC coupling circuit 11 and the potential of the subsequent stage of the AC coupling circuit 11. Thereafter, the potential of the subsequent stage reaches a stationary potential. FIG. 6 shows changes of the potential of the previous stage of the AC coupling circuit 11 and the potential of an output from the AC coupling circuit 11 after the power supply voltage is applied. In FIG. 6, a straight line P indicates the potential of a node P of the previous stage of the AC coupling circuit 11, and varies due to the variance of the sensor. A curve Q indicates the change in potential of an output (node Q) from the AC coupling circuit. As shown in FIG. 6, an output from the AC coupling circuit 11 varies until the charge corresponding to the potential difference is charged in a capacitor $C_1$, and then is converged to a stationary potential expressed by R (reference potential obtained by the resistors $R_{11}$ and $R_{12}$).

As described above, when a potential difference across the AC coupling circuit is generated due to the variance of a sensor after a power supply voltage is applied, a predetermined elapsed time is required after applying the power supply voltage until the potential of the subsequent stage of the AC coupling circuit reaches a stationary potential. The elapsed time depends on the time constant of the AC coupling circuit, and the signal processing circuit cannot normally operate as an AC signal processing circuit during the elapsed time.

SUMMARY OF THE INVENTION

The present invention has been made to solve the above problem, and has its object to provide an AC coupling circuit which equalizes the potentials between nodes before and after the AC coupling circuit immediately after a power supply voltage is applied, thereby making the potential of the previous stage of the AC coupling circuit rapidly reach a stationary potential.

In a first aspect of the invention, an AC coupling circuit is provided for receiving an output signal from a signal processing circuit having a first differential amplifier which has an inverting input and a non-inverting input, and for transmitting the output signal to a stage subsequent to the signal processing circuit as an AC signal. The first differential amplifier receives an input signal with a predetermined potential and a signal with a reference potential to differentially amplify the signals. The AC coupling circuit comprises a CR circuit including a resistor and a capacitor, and a feedback circuit. The feedback circuit includes a second differential amplifier for detecting a potential difference between a node of a stage previous to the CR circuit and a node of a stage subsequent to the CR circuit with reference to the potential of the node of the subsequent stage to the CR circuit to amplify the potential difference. The feedback circuit feeds back the amplified potential difference to the non-inverting input of the first differential amplifier of the signal processing circuit.

According to the coupling circuit thus configured, the potentials of the previous stage and the subsequent stage to the AC coupling circuit can be made equal to each other immediately after a power supply voltage is applied, and the potential of the subsequent stage can be rapidly caused to reach a stationary potential. Therefore, even though the sensor has variance, the signal processing circuit connected to the AC coupling circuit can be rapidly and normally operated immediately after the power supply voltage is applied.

In the AC coupling circuit, the first differential amplifier may receive the input signal with a predetermined potential and the signal with a reference potential through a buffer circuit which has an output end connected to a resistor and performs impedance conversion. A product of a resistance of the resistor included in the CR circuit and a gain of the second differential amplifier may be equal to the resistance of the resistor connected to the output end of the buffer circuit.

Thus, the capacitance of a capacitor of the CR coupling circuit can be arbitrarily set, and the degree of freedom of selection of capacitors can be increased. Therefore the manufacturing cost of a signal processing circuit using this circuit can be reduced.

In the AC coupling circuit, the feedback circuit may further include a buffer circuit which has an output end connected to a resistor and performs impedance conversion. The potential difference amplified by the second differential amplifier may be fed back to the non-inverting input of the first differential amplifier of the signal processing circuit through the buffer circuit.

Thus, the capacitance of a capacitor in the CR circuit can be arbitrarily set without considering circuit constants, the degree of freedom of selection of capacitors can be increased.

In a second aspect of the invention, an AC coupling circuit is provided for receiving an output signal from a signal processing circuit having a first differential amplifier which has an inverting input and a non-inverting input, and for transmitting the output signal to a stage subsequent to the signal processing circuit as an AC signal. The first differential amplifier receives a input signal with a predetermined potential and a signal with a reference potential to differentially amplify the signals. The AC coupling circuit comprises a CR circuit including a resistor and a capacitor, and a feedback circuit. The feedback circuit includes a second differential amplifier for detecting a potential difference between a node of a stage previous to the CR circuit and an ode of a stage subsequent to the CR circuit with reference to the potential of the node of the previous stage to the CR circuit to amplify the potential difference. The feedback circuit feeds back the amplified potential difference to the non-inverting input of the first differential amplifier of the signal processing circuit. The second differential amplifier has a gain equal to a reciprocal value of a gain of the first differential amplifier.

According to the coupling circuit thus configured, the potentials of the previous stage and the subsequent stage to the AC coupling circuit can also be made equal to each other immediately after a power supply voltage is applied, and the potential of the subsequent stage can be rapidly caused to reach a stationary potential. Therefore, even though the sensor has variance, the signal processing circuit connected to the AC coupling circuit can be rapidly and normally operated immediately after the power supply voltage is applied.

DETAILED DESCRIPTION OF THE PREFERRED EMBODIMENTS

Embodiments of an AC coupling circuit according to the present invention will be described below with reference to the accompanying drawings.
Embodiment 1

Figure 1:
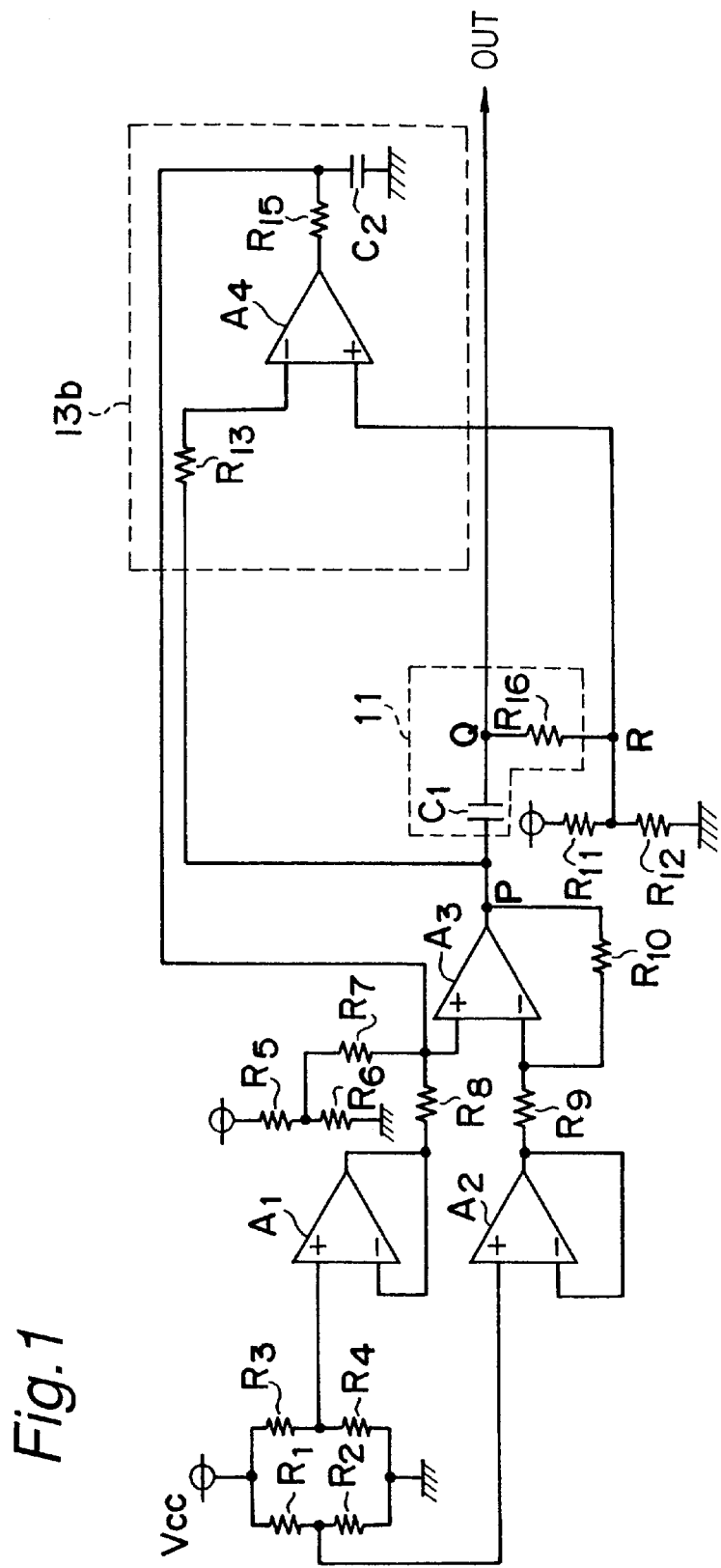
FIG. 1 is a circuit diagram including an AC coupling circuit according to Embodiment 1 of the present invention.

FIG. 1 is a circuit diagram showing a signal processing circuit and an AC coupling circuit according to the present invention connected to the signal processing circuit at a subsequent stage thereof. In FIG. 1, the signal processing circuit has a half bridge circuit comprising resistors $R_1$ and $R_2$ serving as sensors, a half bridge circuit comprising resistors $R_3$ and $R_4$ for giving reference potentials for sensing operation, buffers $A_1$ and $A_2$ each comprising difference amplifiers, and a first-stage amplifier $A_3$ comprising a difference amplifier for differentially amplifying outputs from the buffers $A_1$ and $A_2$. Output ends of the buffers $A_1$ and $A_2$ are connected to outputs resistors R8 and R9, respectively. The buffers $A_1$ and $A_2$ are used to convert impedance (the other buffers described later are similar to those buffers $A_1$ and $A_2$).

The AC coupling circuit comprises a CR circuit 11 and a feedback circuit unit 13b for feeding back an output from the CR circuit 11, and is connected to the subsequent stage of the first-stage amplifier $A_3$. The CR circuit 11 comprises a capacitor $C_1$ and a resistor $R_{16}$. The feedback circuit unit 13b detects a potential difference between previous and subsequent nodes P and R of the CR circuit 11 with reference to the potential of the node R which is at the subsequent stage of the CR circuit 11, and feeds back the potential difference to the first-stage amplifier $A_3$. The AC coupling circuit outputs an AC signal as a sensor output from a node Q by using a potential determined by resistors $R_{11}$ and $R_{12}$ as a reference potential.

The feedback circuit unit 13b of the AC coupling circuit will be described below. The feedback circuit unit 13b includes an integrating circuit comprising a differential amplifier $A_4$, a resistor $R_{15}$, and a capacitor $C_2$.

The differential amplifier $A_4$ of the feedback circuit unit 13b detects a potential difference between the previous node and the subsequent node of the CR circuit 11 with reference to the potential of the subsequent stage (node R) of the CR circuit 11. The potential difference detected by the differential amplifier $A_4$ is fedback to a non-inverting input(+) of the first-stage amplifier $A_3$ through an integrating circuit comprising the resistor $R_{15}$ and the capacitor $C_2$.

At this time, by a feedback signal from the feedback circuit unit 13b, in order to compensate for only a potential difference component generated by the variance of a sensor output in an input signal to the first-stage amplifier $A_3$, an output resistor $R_8$ of the buffer $A_1$ and the resistor $R_{15}$ of the integrating circuit must be set to have equal resistances. More specifically, when the resistances of the resistors $R_8$ and $R_{15}$ are set to be equal to each other, a variable potential difference (input of the differential amplifier $A_1$) of the sensor input to the first-stage amplifier $A_3$ is canceled by an opposite-phase signal from the differential amplifier $A_4$. The time constant of the integrating circuit must be set to be a value falling in a range in which a variance generated by initial variations and temperature characteristics in manufacturing the sensor can be detected and a sensing signal (AC signal) of the sensor cannot be detected.

When a feedback system is constituted for the AC coupling circuit as described above, even if an output of a sensor which is a potential at a connection point of the resistors $R_1$ and $R_2$ are varied by the variations of the sensors in manufacturing and temperature characteristics, and if the DC component of the output from the first-stage amplifier $A_3$ varies with respect to the reference potential of the subsequent stage comprising the resistors $R_{11}$ and $R_{12}$, the potential difference detected by the differential amplifier $A_4$ of the feedback circuit unit 13b is fed back to the first-stage amplifier $A_3$. Thus, the potential difference varied by the variance is compensated. Further, the potential difference between the nodes before and after the CR circuit 11 is directly fed back to compensate for the variation caused by the variance of the sensor output, and thus a dynamic range of a signal which can be processed is extended and the influence of an error such as an offset voltage of the circuit can be reduced.

Figure 2:
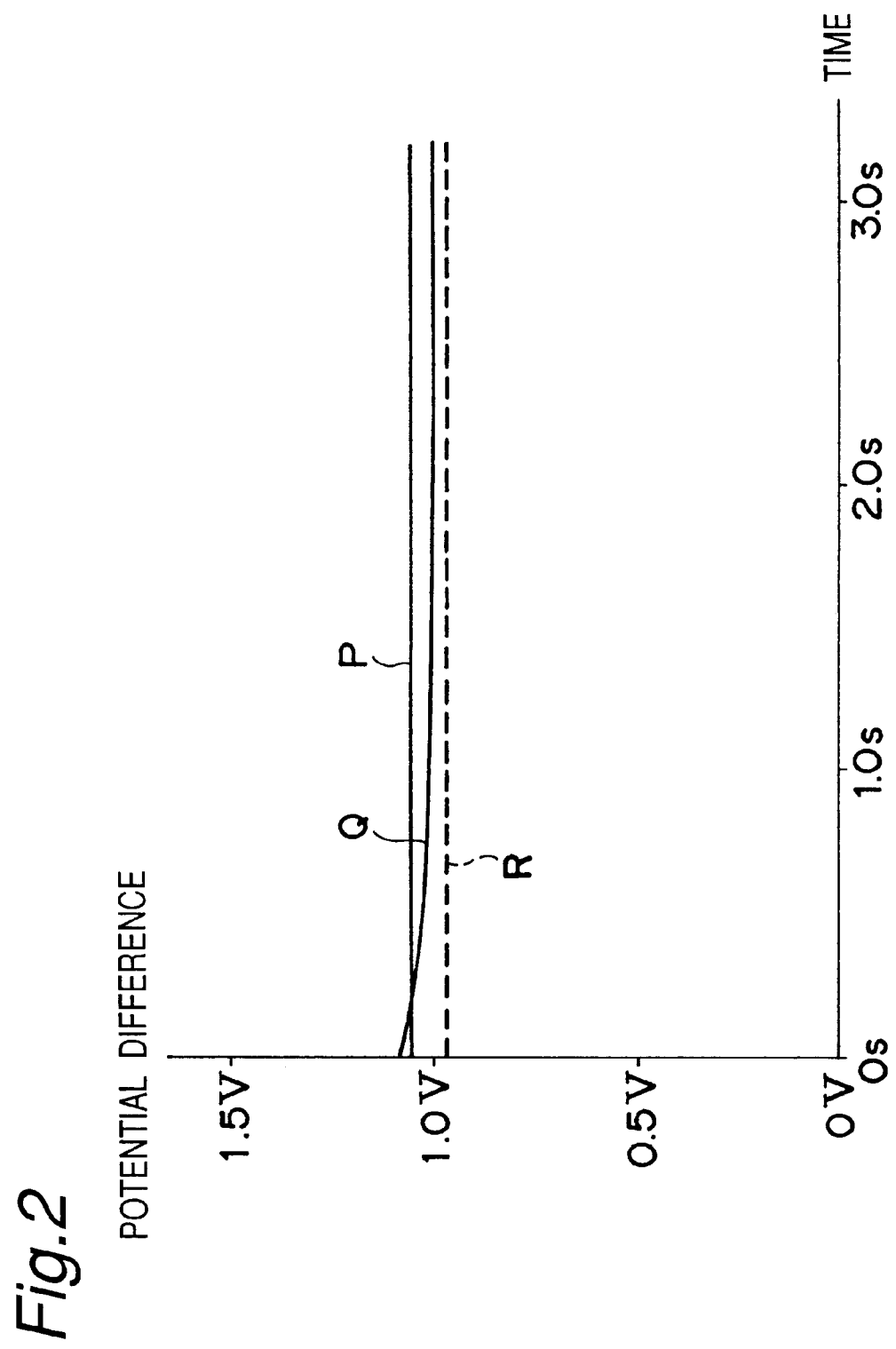
FIG. 2 is a graph showing a change in potential of a stage previous to the AC coupling circuit and a change in potential of an output signal of the AC coupling circuit, after a power supply voltage is applied, when using the AC coupling circuit according to this embodiment.
Figure 5:
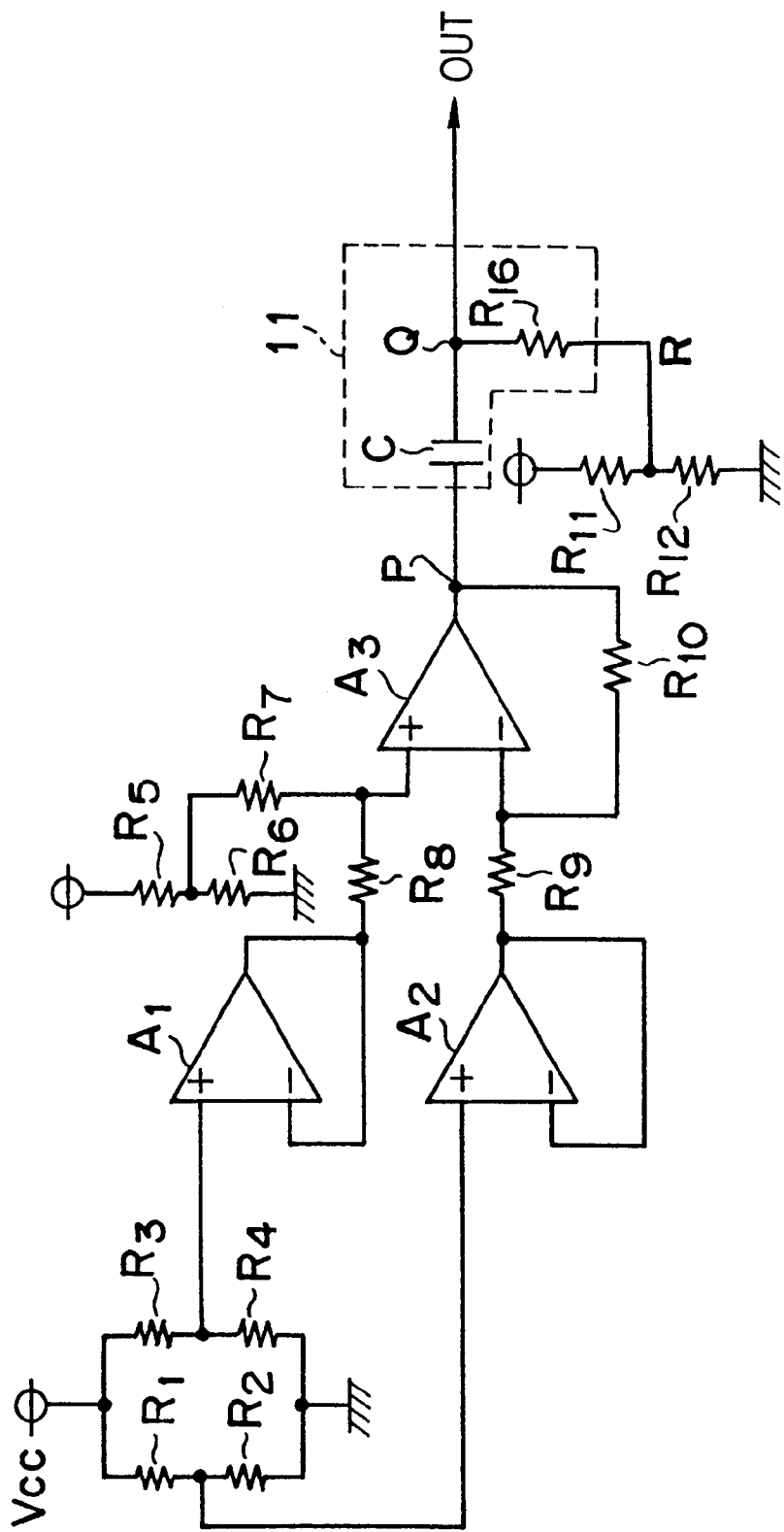
FIG. 5 is a circuit diagram including a conventional AC coupling circuit.
Figure 6:
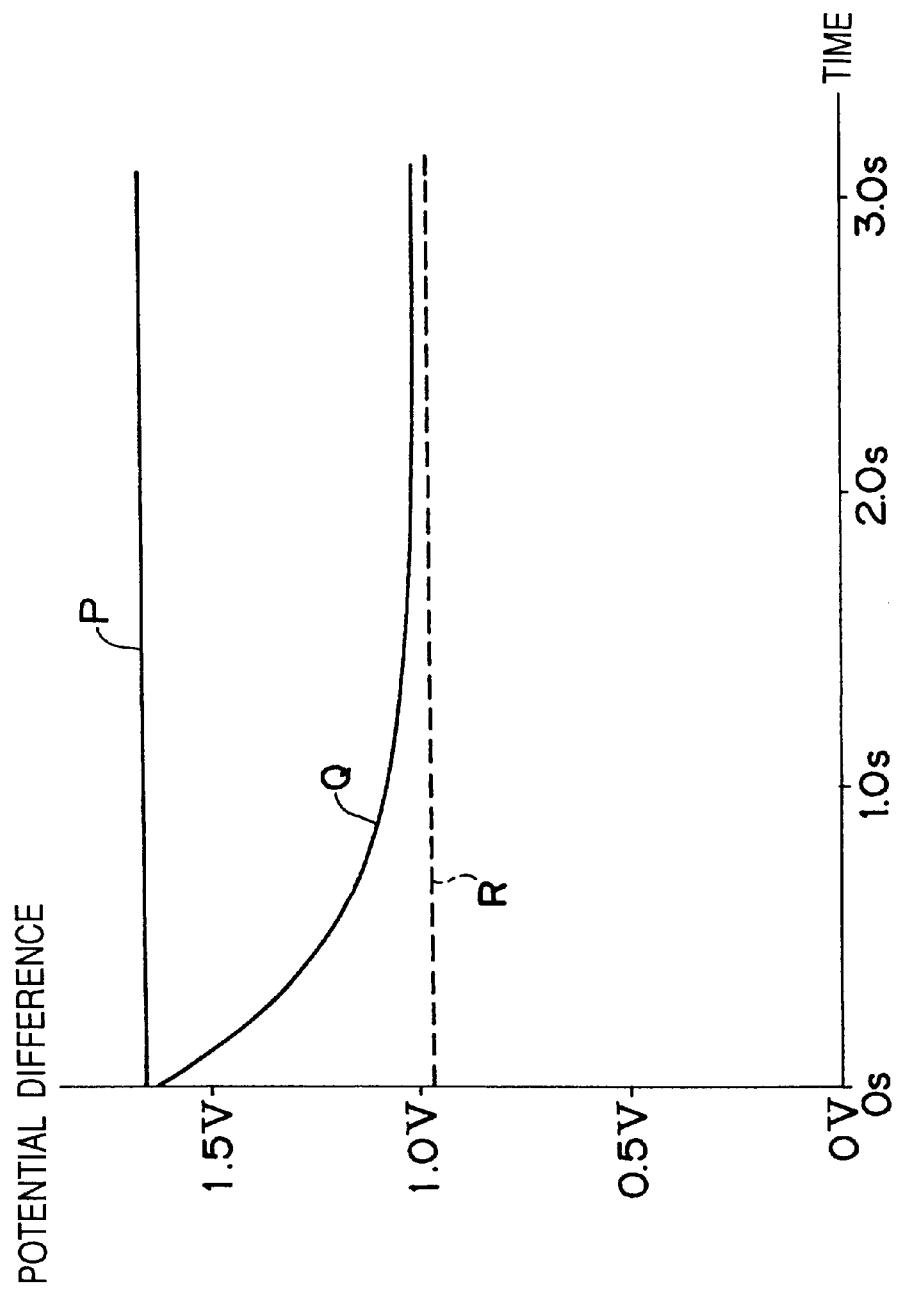
FIG. 6 is a graph showing a change in potential at a stage previous to the AC coupling circuit and a change in potential of an output signal of the AC coupling circuit, after a power supply voltage is applied, when using a conventional AC coupling circuit.

FIG. 2 shows a change in potential of a node before the AC coupling circuit and a change in potential of an output signal of the AC coupling circuit according to this embodiment, after a power supply voltage is applied. In FIG. 2, a curve P indicates the potential of a node P, that is, the potential of node before the CR circuit 11, and a curve Q indicates the potential of a node Q, that is, potential of the output of the AC coupling circuit. A straight line R indicates the potential of a node R, that is, a stationary value to which the curve Q approximates. Compared to the case in FIG. 5, the potentials of both ends of the capacitor $C_1$ in the CR circuit 11 in FIG. 2 are almost equal to each other. Therefore, time required for charging the capacitor $C_1$ can be considerably shortened.

Embodiment 2

In the example described in Embodiment 1, the value of the resistor $R_{15}$ must be set to be equal to the value of the output resistor $R_8$ of the buffer $A_1$, and the time constant of the integrating circuit must be determined depending on the operation frequency of the sensor. For this reason, the capacitance of the capacitor $C_2$ is limited to a predetermined range, and a designer may not be able to select a desired capacitor (for example, an inexpensive one).

In order to solve the problem described above in the circuit shown in FIG. 1, the values of respective elements are set such that a product of the value of the resistor $R_{15}$ constituting the integrating circuit and a gain of the differential amplifier $A_4$ is equal to the value of the output resistor $R_8$ of the buffer stage. When the values of the respective elements are determined as described above, the value of the capacitor $C_2$ is not limited to the predetermined range, and an inexpensive capacitor can be selected. As a result, the manufacturing cost of a product using a circuit according to the invention can be reduced.

Embodiment 3

Another configuration of a feedback circuit in an AC coupling circuit for solving the problem of the capacitor $C_2$ of the integrating circuit described above is shown in FIG. 3.

Figure 3:
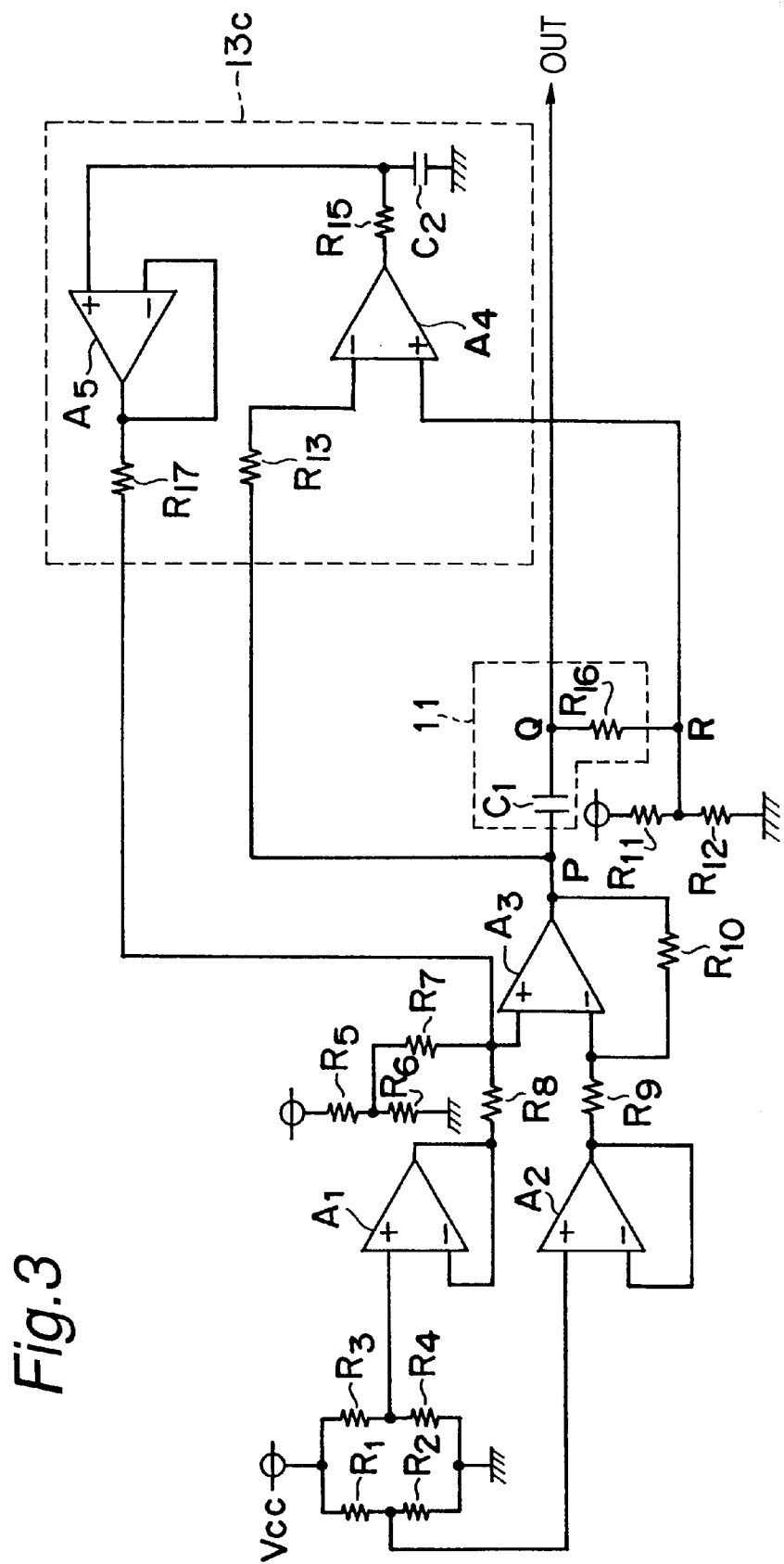
FIG. 3 is a circuit diagram including an AC coupling circuit according to Embodiment 2 of the present invention.

A feedback circuit 13c shown in FIG. 3 is obtained by adding a differential amplifier having an output resistor $R_{17}$ connected thereto to the configuration of the feedback circuit unit 13b of shown in FIG. 1, and further comprises a buffer $A_5$ for performing impedance conversion to feed back a detection value of a potential difference of a CR circuit 11 to a first-stage amplifier $A_3$ through the buffer $A_5$.

When the buffer stage for performing impedance conversion is arranged in the feedback circuit 13c, the influence of a resistor $R_{15}$ and a capacitor $C_2$ on the previous stage of the buffer $A_5$ is canceled. Therefore in order to compensate for only the potential difference component of the variance of a sensor output to the first-stage amplifier $A_3$, it is enough that the resistance of the output resistor $R_{17}$ of the buffer $A_5$ is set to be equal to the resistance of an output resistor $R_8$ of a buffer $A_1$. Thus, the resistance of the resistor $R_{15}$ can be set to be large, and the capacitance of the capacitor $C_2$ can be set to be small. In addition, the circuit constants as described in Embodiment 2 need not be considered, and the degree of freedom in design can be increased. In addition, since the capacitance of the capacitor can be suppressed to a low level, an inexpensive product can be realized.

Embodiment 4

Figure 4:
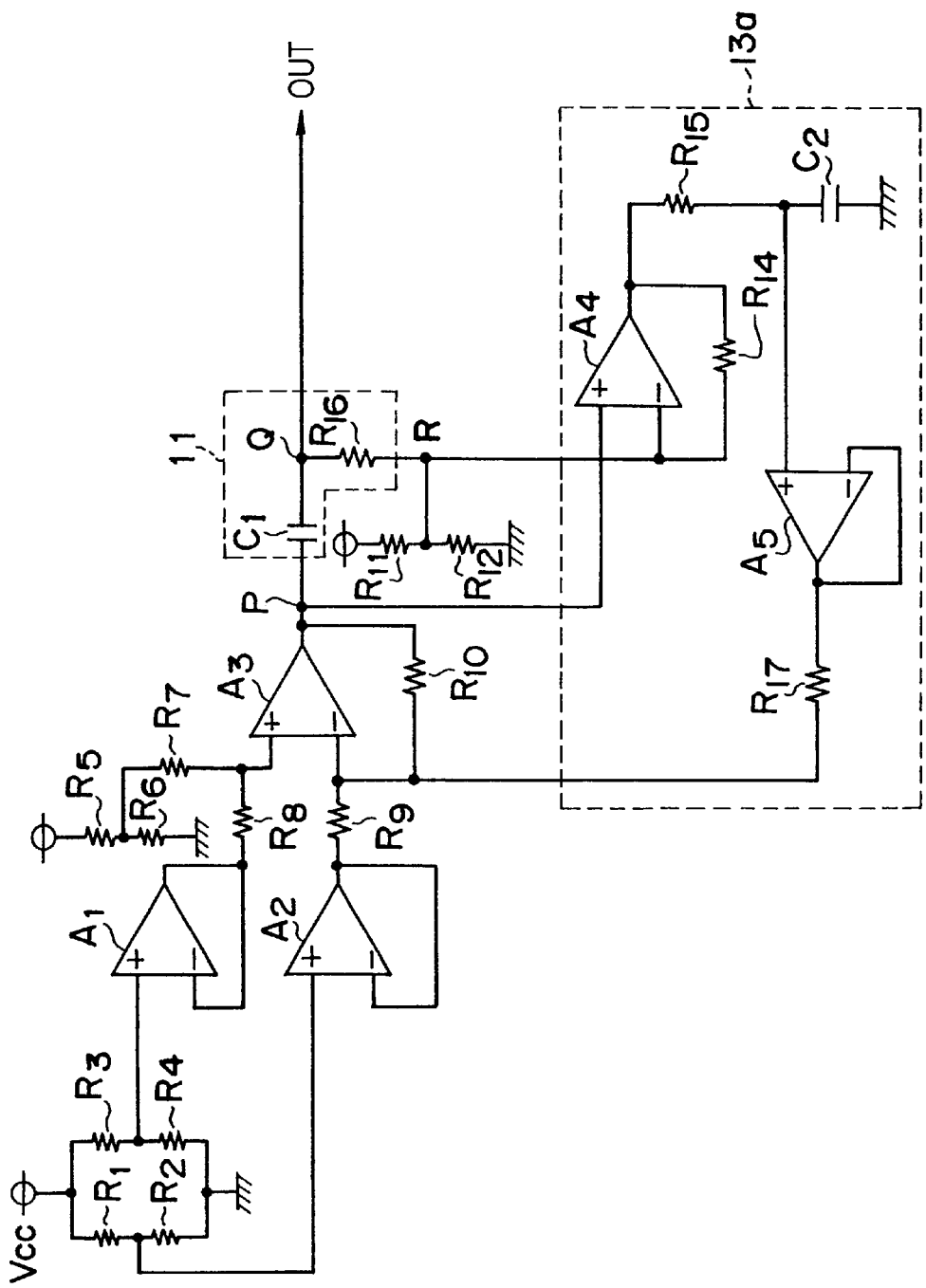
FIG. 4 is a circuit diagram including an AC coupling circuit according to Embodiment 4 of the present invention.

FIG. 4 shows still another configuration of an AC coupling circuit according to the present invention.

The AC coupling circuit according to this embodiment comprises a CR circuit 11 and a feedback circuit unit 13a for feeding back an output from the CR circuit 11. The CR circuit 11 comprises a capacitor $C_1$ and a resistor $R_{16}$. The feedback circuit unit 13a detects a potential difference between nodes P and R of the previous stage and the subsequent stage of the CR circuit 11 with reference to the potential of the node P of the previous stage of the CR circuit 11, and feeds back the potential difference to a first-stage amplifier $A_3$.

In the feedback circuit unit 13b according to the above embodiment shown in FIG. 1, the potential difference between the previous stage and the subsequent stage of the CR circuit 11 is detected with reference to the potential of the subsequent stage (node R) of the CR circuit 11. In contrast to this, in the feedback circuit unit 13a according to this embodiment shown in FIG. 3, the potential difference between the previous stage and the subsequent stage of the CR circuit 11 is detected with reference to the potential of the previous stage (node P) of the CR circuit 11. The feedback circuit unit 13a will be described below in detail.

The feedback circuit unit 13a comprises a differential amplification stage comprising a differential amplifier $A_4$ and a resistor $R_{14}$, an integrating circuit constituted by a resistor $R_{15}$ and a capacitor $C_2$, a buffer $A_5$ comprising a differential amplifier, and a resistor $R_{17}$ connected to the output terminal of the buffer $A_5$.

The differential amplifier $A_4$ of the feedback circuit unit 13a detects the potential difference between the previous stage and the subsequent stage of the CR circuit 11, that is, the potential difference between the node P and the node R, with reference to the potential of previous stage (node P) of the CR circuit 11. The potential difference detected by the differential amplifier $A_4$ is fed back to the inverting input(−) of the first-stage amplifier $A_3$ through the integrating circuit constituted by the resistor $R_{15}$ and the capacitor $C_2$ and the buffer $A_5$. Here, the circuit gain of the differential amplifier $A_4$ must be set to be the value of the reciprocal of the circuit gain of the first-stage amplifier $A_3$. Since the potential difference detected by the differential amplifier $A_4$ is the variance (potential difference to be compensated) of the sensor with respect to the inverting input of the differential amplifier $A_3$, the potential difference is amplified by the differential amplifier $A_3$. Therefore, the potential difference cannot be fed back directly. An increased component of the potential difference by amplification of the differential amplifier $A_4$ must be attenuated so that the potential difference before amplification is fedback and compensated. For example, when the circuit gain of the differential amplifier $A_3$ is 5, the circuit gain of the differential amplifier $A_4$ is set to be ⅕.

In this case, by the feed back signal in order to compensate for only the potential difference component generated by the variance of an output from the sensor in an input from the first-stage amplifier $A_3$, the resistor $R_8$ and the resistor $R_{17}$ must be set to have equal resistances. More specifically, when the resistances of the resistors $R_6$ and $R_{17}$ are set to have equal resistances, a variation of potential difference (input of the differential amplifier $A_1$) of the sensor input to the first-stage amplifier $A_3$ is canceled by an opposite phase signal from the differential amplifier $A_4$. The time constant of the integrating circuit must be set to be a value within a range in which a variance by initial variations in manufacturing the sensor and temperature characteristics can be detected and a sensing signal (AC signal) of the sensor cannot be detected.

With the above circuit configuration, the potential difference detected by the differential amplifier $A_4$ of the feedback circuit unit 13a is fed back to the first-stage amplifier $A_3$, even when an output from the sensor which is a potential of a node connecting the resistors $R_1$ to the resistor $R_2$ is varied by variations in manufacturing the sensor and the temperature characteristics, and the DC component of the output from the first-stage amplifier $A_3$ is varied with reference to a potential of the subsequent stage comprising $R_{11}$ and $R_{12}$. Thus, the potential difference varied by the variations is compensated.

Although the present invention has been described in connection with specified embodiments thereof, many other modifications, corrections and applications are apparent to those skilled in the art. Therefore, the present invention is not limited by the disclosure provided herein but limited only to the scope of the appended claims.

What is claimed is:

1. An AC coupling circuit for receiving an output signal from a signal processing circuit having a first differential amplifier which has an inverting input and a non-inverting input, and for transmitting the output signal to a stage subsequent to the signal processing circuit as an AC signal, the first differential amplifier receiving an input signal with a predetermined potential and a signal with a reference potential to differentially amplify the signals, the AC coupling circuit comprising:

a CR circuit including a resistor and a capacitor; and a feedback circuit including a second differential amplifier for detecting a potential difference between a node of a stage previous to the CR circuit and a node of a stage subsequent to the CR circuit with reference to the potential of the node of the subsequent stage to the CR circuit to amplify the potential difference, the feedback circuit feeding back the amplified potential difference to the non-inverting input of the first differential amplifier of the signal processing circuit.

2. The AC coupling circuit according to claim 1, wherein the first differential amplifier receives the input signal with a predetermined potential and the signal with a reference potential through a buffer circuit which has an output end connected to a resistor and performs impedance conversion, and a product of a resistance of the resistor included in the CR circuit and a gain of the second differential amplifier is equal to the resistance of the resistor connected to the output end of the buffer circuit.

3. The AC coupling circuit according to claim 1, wherein the feedback circuit further includes a buffer circuit which has an output end connected to a resistor and performs impedance conversion, and the potential difference amplified by the second differential amplifier is fed back to the non-inverting input of the first differential amplifier of the signal processing circuit through the buffer circuit.

4. An AC coupling circuit for receiving an output signal from a signal processing circuit having a first differential amplifier which has an inverting input and a non-inverting input, and for transmitting the output signal to a stage subsequent to the signal processing circuit as an AC signal, the first differential amplifier receiving an input signal with a predetermined potential and a signal with a reference potential to differentially amplify the signals, the AC coupling circuit comprising:

a CR circuit including a resistor and a capacitor; and a feedback circuit including a second differential amplifier for detecting a potential difference between a node of a stage previous to the CR circuit and a node of a stage subsequent to the CR circuit with reference to the potential of the node of the previous stage to the CR circuit to amplify the potential difference, the feedback circuit feeding back the amplified potential difference to the non-inverting input of the first differential amplifier of the signal processing circuit, the second differential amplifier having a gain equal to a reciprocal value of a gain of the first differential amplifier.

5. The AC coupling circuit according to claim 4, wherein the feedback circuit further includes a buffer circuit which has an output end connected to a resistor and performs impedance conversion, and the potential difference amplified by the second differential amplifier is fed back to the non-inverting input of the first differential amplifier of the signal processing circuit through the buffer circuit.

* * * * *